(12) United States Patent
Fan et al.

(10) Patent No.: US 6,958,546 B2
(45) Date of Patent: Oct. 25, 2005

(54) METHOD FOR DUAL-LAYER POLYIMIDE PROCESSING ON BUMPING TECHNOLOGY

(75) Inventors: Fu-Jier Fan, Jubei (TW); Cheng-Yu Chu, Hsinchu (TW); Kuo Wei Lin, Hsinchu (TW); Shih-Jang Lin, Hsinchu (TW); Yang-Tung Fran, Jubei (TW); Chiou-Shian Peng, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 326 days.

(21) Appl. No.: 10/437,373

(22) Filed: May 13, 2003

(65) Prior Publication Data

US 2003/0199159 A1 Oct. 23, 2003

Related U.S. Application Data

(62) Division of application No. 09/664,417, filed on Sep. 18, 2000, now Pat. No. 6,586,323.

(51) Int. Cl.[7] ............................................. H01L 23/48
(52) U.S. Cl. ........................ 257/773; 257/779; 257/780; 257/781
(58) Field of Search .................. 257/773, 779, 257/780, 781, 734, 760

(56) References Cited

U.S. PATENT DOCUMENTS

| 5,492,235 A | 2/1996 | Crafts et al. ................... 216/13 |
| 5,834,844 A | * 11/1998 | Akagawa et al. ............ 257/734 |
| 5,903,058 A | 5/1999 | Akram ........................ 257/778 |
| 5,946,590 A | 8/1999 | Satoh .......................... 438/613 |
| 6,028,011 A | 2/2000 | Takase et al. ................ 438/745 |
| 6,046,101 A | * 4/2000 | Dass et al. ................... 438/624 |

* cited by examiner

*Primary Examiner*—Amir Zarabian
*Assistant Examiner*—Christy Novacek
(74) *Attorney, Agent, or Firm*—Duane Morris LLP

(57) ABSTRACT

A new method and processing sequence is provided for the formation of solder bumps that are in contact with underlying aluminum contact pads. A patterned layer of negative photoresist is interposed between a patterned layer of PE $Si_3N_4$ and a patterned layer of polyamide insulator. The patterned negative photoresist partially overlays the aluminum contact pad and prevents contact between the layer of polyamide insulator and the aluminum contact pad. By forming this barrier no moisture that is contained in the polyamide insulator can come in contact with the aluminum contact pad, therefore no corrosion in the surface of the aluminum contact pad can occur.

9 Claims, 1 Drawing Sheet

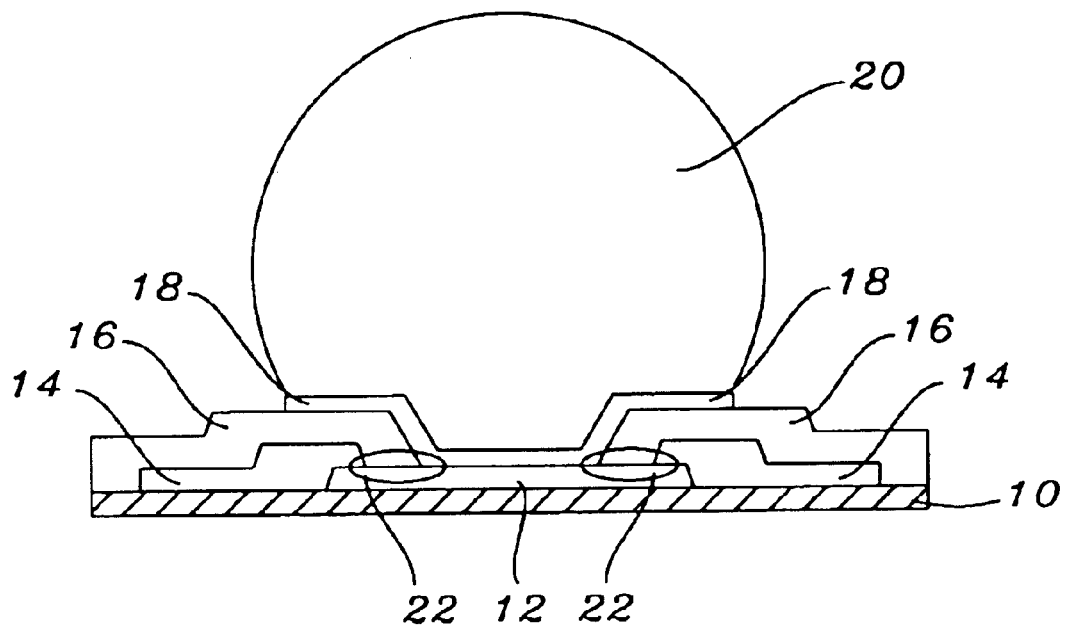
FIG. 1 – Prior Art
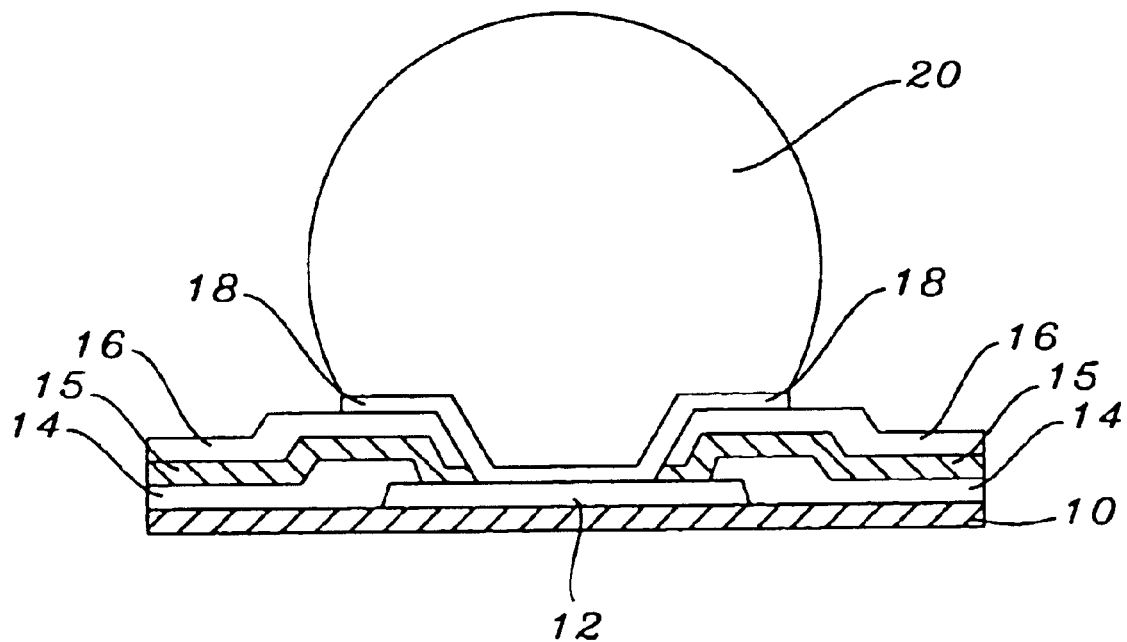
FIG. 2

METHOD FOR DUAL-LAYER POLYIMIDE PROCESSING ON BUMPING TECHNOLOGY

This is a division of patent application Ser. No. 09/664,417, filing date Sep. 18, 2000, now issued as U.S. Pat. No. 6,586,323, Novel Method For Dual Layer Polyimide Processing On Bumping Technology, assigned to the same assignee as the present invention.

BACKGROUND OF THE INVENTION (1) Field of the Invention

The invention relates to the fabrication of integrated circuit devices, and more particularly, to a method to create solder bumps for the interconnection of semiconductor devices.

(2) Description of the Prior Art

Semiconductor technology has, ever since its inception, improved semiconductor device performance by reducing device dimensions and, concurrently, increasing device packaging density. In the field of high density interconnect technology, it is necessary for many of the packaging approaches to fabricate a multilayer structure on a substrate in order to connect integrated circuits to one another. To achieve a high wiring and packing density, many integrated circuit chips are physically and electrically connected to a single substrate commonly referred to as a multi-chip module (MCM). Typically, layers of a dielectric such as a polyimide separate metal power and ground planes in the substrate. Embedded in other dielectric layers are metal conductor lines with vias (holes) providing electrical connections between signal lines or to the metal power and ground planes.

The methods that are used to interconnect a semiconductor device to an underlying substrate can be differentiated in methods of wire bonding (device interconnect points are provided around the periphery of the device, a factor that limits the number of input/output connections that can be made to the device), tape automatic bonding (device interconnect points are provided around the periphery of the device, again limiting I/O capability) and C4 or Controlled Collapse Chip Connection methods. The latter method of C4 interconnect offers the advantage of providing high input/output capability since the interconnect bumps can be placed in any location on the chip. The C4 technology offers, in addition to high I/O interconnect capacity, the advantage of short solder bumps (improving the electrical performance of the interconnect) while the process of reflow that is used to connect the solder bumps with the substrate allows the formation of a self-aligned interface between the solder bump and the contact point in the substrate to which the solder bump is connected.

For the formation of solder bumps, two different and well established technologies can be used, that is evaporation and electroplating. Other methods that are used are methods of adhesive applying, stud-bumping methods and the like. These latter methods will not be further discussed at this point.

The method of electroplating follows the processing steps of (over the surface of a substrate wherein a point of electrical contact, typically containing aluminum, has been provided, all steps of processing being centered around this point of electrical contact) depositing a layer of polyimide and etching an opening in this layer of polyimide that aligns with the point of contact, depositing (by vacuum evaporation) a layer of Under Bump Metallurgy (UBM, also referred to as Ball Limiting Metallurgy or BLM) over the layer of poly including the opening created in the layer of poly. A layer of photoresist is deposited over the layer of UBM and patterned, creating an opening in the layer of photoresist that aligns with that part of the layer of UBM that remains in place under the to be created solder bump. Next a layer of metal (typically copper) is electroplated over the layer of photoresist whereby the layer of UBM serves as the common electrode for the electroplating process, the electroplated metal is in contact with the layer of UBM. A layer of solder is next plated over the layer of electroplated metal. The layer of electroplated metal is centered around the opening that has been created in the layer of photoresist as is the layer of plated solder. The photoresist is removed using the solder bump as a mask, the layer of UBM is selectively etched and removed where this layer does not underlie the to be created solder bump in order to electrically isolate the solder bumps from each other. A critical step of the process is performed as a final step whereby a flux is applied to the plated solder and the solder is melted in a reflow furnace under a nitrogen atmosphere, creating a spherically shaped solder bump. The above summarized processing steps of electroplating that are used for the creation of a solder bump can be supplemented by the step of curing or pre-baking of the layer of photoresist after this layer has been deposited over the layer of UBM.

The process of evaporation also starts with a semiconductor surface wherein a metal point of contact has been provided. A layer of passivation is deposited and patterned, creating an opening in the layer of passivation that aligns with the metal point of contact. A layer of UBM is formed over the layer of passivation and inside the opening created in the layer of passivation. The UBM layer may be a composite layer of metal such as chromium followed by copper followed by gold in order to promote (with the chromium) improved adhesion of the UBM layer and to form a diffusion barrier layer or to prevent oxidation (with the gold over the copper). Solder is next selectively plated over the deposited layer of UBM and melted in a solder reflow surface in a hydrogen ambient for solder reflow, in this manner forming the spherically shaped solder bumps.

Some of the problems that have over time been experienced using the various processes are:
- electroplating suffers from the problem that the etching of the layer of UBM may affect the solder that has been deposited since this solder is readily attacked by an acid solution; any acid that is used for the etching of the layer of UBM may adversely affect the deposited solder
- the previous problem of the solder being affected during the UBM etch can be reduced by the application of a second mask that protects the deposited solder during the UBM etch; this however adds complexity and expense to the process of the formation of solder bumps while the additional mask complicates the processing sequence
- the polyimide that is used during the electroplating procedure is difficult to completely remove from the opening that is etched in the layer of poly that aligns with the point of electrical contact; this creates a poorly defined opening in the layer of poly, which in turn results in a low quality contact between the solder bump and the underlying point of electrical contact
- the process of electroplating is relatively complex and requires a significant number of processing steps
- the process of evaporation is generally more expensive than the process of electroplating, and
- the process of evaporation is, for decreased device dimensions, more difficult to control and therefore does not lend itself well to the era of sub-micron devices.

The present invention addresses concerns of the prior art method of forming solder bumps on a semiconductor surface. This prior art method is highlighted in FIG. 1, which contains the following sub-components:

10 is a semiconductor surface on which the solder bump is to be created 12 is the metal contact pad, typically containing aluminum, which is to be brought into contact with the solder bump and over which the solder bump therefore is to be created 14 is a patterned layer of Plasma Enhanced silicon nitride which serves as an etch stop layer for the etch of the overlying layer 16 of insulation that contains polyimide (a polyimide insulator or PI coating)

18 is a layer of Under Bump Metallurgy (UBM), and 20 is the created solder bump.

The prior art processing sequence for the formation of the solder bump that is shown in FIG. 1 is as follows:

depositing a layer of PE $Si_3N_4$ over the semiconductor surface 10 thereby including the surface of the aluminum pad 12 patterning and etching the deposited layer of PE $Si_3N_4$, creating an opening in the layer of PE $Si_3N_4$ that aligns with the aluminum pad 12 applying a coating 16 of polyimide insulator (PI) over the surface of the layer 14 of PE $Si_3N_4$ including the exposed surface of the aluminum contact pad 12 patterning and etching the layer 16 of PI, creating an opening in the layer 16 of PI that aligns with the aluminum pad 12 curing the etched layer 16 of PI depositing a layer 18 of Under Bump Metallurgy (UBM) over the surface of the etched and cured layer 16 of PI selectively depositing a layer (not shown in FIG. 1) of Pb/Sn to form solder bumps selectively etching the deposited layer 18 of UBM to electrically isolate the solder bumps from each other using the deposited layer of Pb/Sn as a mask, and melting the selectively deposited Pb/Sn in a reflow furnace creating the spherically shaped solder bump 20.

The problem areas that appear as part of the prior art processing sequence that is shown in FIG. 1 are the regions 22. Layer 16 of polyimide insulator is used for isolation and for planarization during the processing sequence of forming solder bumps. Polyimide however is prone to water absorption, the layer 16 is in contact with the aluminum pad 12 in regions 22. Even minute traces of water that are present in the layer 16 of polyimide insulator causes corrosion of the surface of the aluminum pad 12 in regions 22, resulting in poor adhesion between the layer 16 of polyimide insulator and the aluminum pad 12.

U.S. Pat. No. 5,946,590 (Satoh) shows a bump process using 2 organic layers for plating.

U.S. Pat. No. 5,492,235 (Crafts et al.) shows a bump creation process using UBM, and creating the bump by evaporation.

U.S. Pat. No. 5,903,058 (Akram) and U.S. Pat. No. 6,028,011 (Takase et al.) show other related bump processes.

SUMMARY OF THE INVENTION

A principle objective of the invention is to create a solder bump whereby no corrosion occurs in the surface of the aluminum contact pad to which the solder bump is connected.

Another objective of the invention is to provide improved adhesion between the structure of the solder bump and the underlying contact pad of aluminum by creating a layer of negative photoresist that is in contact with a portion of the surface of the underlying aluminum contact pad.

Yet another objective of the invention is to provide a method that improves the insulation of an aluminum contact pad and the regions that are adjacent to the aluminum contact pad.

In accordance with the objectives of the invention a new method and processing sequence is provided for the formation of solder bumps that are in contact with underlying aluminum contact pads. Using the process of the invention, a patterned layer of negative photoresist is interposed between a patterned layer of PE $Si_3N_4$ and a patterned layer of polyimide insulator. The patterned negative photoresist partially overlays the aluminum contact pad and prevents contact (that was created using the prior art processing sequence) between the layer of polyimide insulator and the aluminum contact pad. By forming this barrier (between the polyimide insulator and the aluminum contact pad) no moisture that is contained in the polyimide insulator can come in contact with the aluminum contact pad, therefore no corrosion in the surface of the aluminum contact pad will occur.

BRIEF DESCRIPTION OF THE DRAWINGS

FIG. 1 shows a cross section and the therefrom following processing flow of the creation of a prior art solder bump.

FIG. 2 shows a cross section and the therefrom following processing flow of the creation of a solder bump of the invention.

DESCRIPTION OF THE PREFERRED EMBODIMENTS

It must be noted that the use of polyimide films as inter-level dielectrics has been pursued as a technique for providing partial planarization of a dielectric surface. Polyimides offer the following characteristics for such applications:

they produce surfaces in which the step height of underlying features is reduced, step slopes are gentle and smooth they are available to fill small openings without producing the voids that occur when low-temperature CVD oxide films are deposited cured polyimide films can tolerate temperatures of up to 500 degrees C. without degradation of their dielectric film characteristics polyimide films have dielectric breakdowns which are only slightly lower than that of $SiO_2$ the dielectric constant of polyimides is smaller than that of silicon nitride and of $SiO_2$ the process used to deposit and pattern polyimide films is relatively simple.

A layer of polyimide can be deposited by spin-on coating and can be cured after deposition at for instance 400 degrees C. for 1 hour in a vacuum or nitrogen ambient.

Referring now specifically to FIG. 2, there is shown a cross section of the formation of a solder bump using the process of the invention.

Layer 10 is the surface of a semiconductor layer, a contact pad 12 has been created on surface 10. Surface 10 will typically be the surface of a semiconductor substrate, the surface of an interconnect substrate and the like. The essence of surface 10 is that a contact pad 12 has been created on this surface, electrical contact must be established with contact pad 12 by means of an overlying solder bump. Contact pad 12 therefore serves as interface between the solder bump and electrical interconnects that are provided in the surface of layer 10.

A layer 14 of Plasma Enhanced silicon nitride (PE $Si_3N_4$) is deposited over the surface of layer 10 and of contact pad 12.

Insulating layers such as silicon oxide and oxygen-containing polymers are deposited over the surface of various layers of conducting lines in a semiconductor device or substrate to separated the conductive interconnect lines from each other, the insulating layers can be deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip package, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited that further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, passivation layer can be a photosensitive polyimide or can comprise titanium nitride. Another material often used for passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross linked thereby leaving unexposed regions (that are not cross linked) over the bonding pads. During subsequent development, the unexposed polyimide precursor layer (over the bonding pads) is dissolved thereby providing openings over the bonding pads. A final step of thermal curing leaves a permanent high quality passivation layer of polyimide over the substrate.

The preferred material of the invention for the deposition of layer 14 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 14 of PE $Si_3N_4$ can be deposited to a thickness between about 200 and 800 Angstrom.

Layer 14 of PE $Si_3N_4$ is next patterned and etched to create an opening in the layer 14 that overlays and aligns with the underlying contact pad 12.

The etching of layer 14 can use $Ar/CF_4$ as an etchant at a temperature of between about 120 and 160 degrees C. and a pressure of between about 0.30 and 0.40 Torr for a time of between about 33 and 39 seconds using a dry etch process.

The etching of layer 14 can also use $He/NF_3$ as an etchant at a temperature of between about 80 and 100 degrees C. and a pressure of between about 1.20 and 1.30 Torr for a time of between about 20 and 30 seconds using a dry etch process.

A layer 15 of negative photoresist is next deposited over the surface of the layer 14 of PE $Si_3N_4$. The layer 15 of photoresist can be deposited to a thickness of between about 300 and 800 Angstrom.

The methods used for the deposition and development of the layer 15 of negative photoresist uses conventional methods of photolithography. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered insoluble (positive-working) and form the pattern, or insoluble (negative working) and be washed away.

Before layer 15 of negative photoresist is patterned and etched, a layer 16 of polyimide insulator is deposited over the surface of the layer 15 of negative photoresist. Layer 16 can be deposited using methods of spin-on coating whereby this layer 16 of PI can be deposited to a thickness between about 300 and 800 Angstrom.

The layer 15 of negative photoresist will, upon patterning and etching, remain in place over the surface of pad 12 in an area that has the shape of the perimeter of the aluminum pad 12 and that is slightly removed from this perimeter toward the center of pad 12. Negative photoresist will, upon exposure to UV light, harden which is a quality that may be of value in selectively creating a firmer layer 15 of negative photoresist overlying the contact pad 12.

After both layers 15 (of negative photoresist) and 16 (of PI) have been deposited, both layers are patterned and etched forming a stacked layer of negative photoresist and PI overlying the aluminum pad 12.

Polyimide insulating layer 16 can be anisotropically etched with a plasma gas containing carbon tetrofluoride ($CF_4$) as an etchant using a commercially available parallel plate RIE etcher or an Electron Cyclotron Resonance (ECR) plasma reactor. The preferred processing conditions for the etching of insulating layer 16 are as follows: etchant used: $CF_4/CHF_3$, flow rate about 25 sccm, temperature about 40 degrees C., pressure about 225 mTorr, time of the etch between about 160 and 220 seconds.

Layer 15 of negative photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 15 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

After the two layers 15 (photoresist) and 16 (PI) have been patterned and etched, both layers are cured. The curing and cross-linking of layers 15 and 16 provides extra protection to the device circuitry and can be performed in a $N_2$ gas ambient at a temperature of between about 300 and 400 degrees C. for a time period between about 1.5 and 2.5 hours and a pressure of 760 Torr.

At this point in the processing sequence, there exist two layers, that is a layer of patterned negative photoresist (layer 15) and a layer of PI (layer 16), both layers overlying the patterned layer 14 of PE $Si_3N_4$, both layers 15 and 16 have been cured and an opening has been created through both layers over which the solder ball must be formed. The process is, at this point, ready to create the UBM layer and the solder bump.

The next step in the process of the invention is therefore the creation of the layer 18 of UBM by vacuum evaporation, this layer is as yet to be patterned and etched. The surface of layer 18 of UBM is, after its blanket deposition and before patterning of the layer of UBM, selectively plated with solder. This solder plating is aligned with the aluminum pad 12. UBM layer 18 is then etched using the plated solder as a mask. This removes the layer of UBM from areas adjacent to the contact pad 12 and leaves only enough of the UBM in place to form an electrical interface between the solder bump and the contact pad 12. Standard RIE procedures, using $Cl_2$—$BCl_3$ as etchant, can be used to etch the UBM layer 18.

A flux is next applied to the selectively plated solder and the solder is melted in a reflow surface under a nitrogen atmosphere, forming the spherically shaped solder bump 20 that is shown in FIG. 2.

It is clear from FIG. 2 that the surface of the aluminum pad 12 that underlies the layer 16 of polyimide insulator is separated from layer 16 by a layer 15 of negative photoresist. This separation prevents any moisture that is present in the layer 16 from coming in contact with the aluminum pad 12, thus preventing any corrosion of the surface of the aluminum pad 12.

The process of the invention can be summarized as follows:

deposit a layer of PE SiN over the semiconductor surface, including the surface of the aluminum pad pattern the deposited layer of PE SiN forming an opening with a first diameter in the layer of PE SiN that aligns with the aluminum pad, partially exposing the surface of the aluminum pad apply a coating of negative photoresist over the patterned layer of PE SiN, including the exposed surface of the aluminum pad apply a coating of polyimide insulator over the surface of the negative photoresist pattern and etch the layers of photoresist and polyimide insulator, forming a stack of photoresist and polyimide overlying the semiconductor surface while forming an opening with a second diameter through both layers that aligns with the aluminum pad; the above second diameter is smaller than the above first diameter, resulting in the negative photoresist partially overlying the surface of the aluminum pad and forming an interface between the aluminum pad and the layer of polyimide curing the layers of photoresist and polyimide insulator depositing a layer of UBM over the surface of the layer of polyimide insulator, the layer of UBM is in electrical contact with the aluminum pad selectively depositing solder over the surface of the layer of UBM, the solder deposition is aligned with the underlying aluminum pad etching the layer of UBM using the deposited solder as a mask, thus preventing electrical shorts between layers of UBM that are formed for different solder bumps applying a flux or paste to the solder, and flowing the solder, forming the solder bump.

The structure of the invention, which provides a conductive bump overlying a layer of Under Bump Metallization (USM), can be highlighted as follows, based on the cross section that is shown in FIG. 2 of the specification, the structure comprising:

a semiconductor substrate, the semiconductor substrate having been provided with integrated circuitry, at least one layer of passivation over the semiconductor substrate, at least one contact pad in or over the substrate access to the integrated circuitry for external contact by at least one first via having a first diameter through the at least one layer of passivation, the at least one first via being aligned with the at least one contact pad at least one layer of negative photoresist over the at least one layer of passivation, further at least one layer of polyimide over the at least one layer of negative photoresist access to the integrated circuitry for external contact by at least one second via having a second diameter through the at least one layer of polyimide, further through the at least one layer of negative photoresist, the second diameter being smaller than the first diameter, the second via being aligned with the first via a layer of UBM metal over the at least one layer of polyimide, with a portion of the layer of UBM metal layer extending into the at least one second via and further extending into the at least one first via, contacting the integrated circuitry, and a layer of solder or a compound thereof over the layer of UBM metal, the layer of solder or a compound thereof being aligned with the at least one second via.

Alternatively, the structure of the invention, which provides a conductive bump overlying a layer of Under Bump Metallization (UBM), can be highlighted as follows, based on the cross section that is shown in FIG. 2 of the specification, the structure comprising:

a semiconductor surface, the semiconductor surface having been provided with integrated circuitry, at least one layer of passivation over the semiconductor surface, the at least one layer of passivation comprising PE $Si_3N_4$ having a thickness between about 200 and 800 Angstrom, at least one contact pad in or over the substrate access to the integrated circuitry for external contact by at least one first via having a first diameter extending through the at least one layer of passivation, the at least one first via being aligned with the at least one contact pad at least one layer of negative photoresist over the at least one layer of passivation, further at least one layer of polyimide insulator over the at least one layer of negative photoresist, the layer of at least one layer of polyimide insulator having a thickness between about 300 and 800 Angstrom access to the integrated circuitry for external contact by at least one second via having a second diameter through the at least one layer of polyimide insulator, further through the at least one layer of negative photoresist, the second diameter being smaller than the first diameter, the second via being aligned with the first via a layer of UBM metal over the at least one layer of polyimide insulator, with a portion of the layer of UBM metal extending into the at least one second via and further extending into the at least one first via to make electrical contact with the integrated circuitry, the layer of UBM metal comprising one or more layers of different metallic composition; and a layer of solder or a compound thereof over the layer of UBM metal, the layer of solder or a compound thereof being aligned with the at least one second via.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A conductive bump overlying a layer of Under Bump Metallization (UBM), comprising:

a semiconductor substrate, said semiconductor substrate having been provided with integrated circuitry, at least one layer of passivation over said semiconductor substrate, at least one contact pad in or over said substrate;

access to said integrated circuitry for external contact by at least one first via having a first diameter through said at least one layer of passivation, said at least one first via being aligned with said at least one contact pad;

at least one layer of negative photoresist over said at least one layer of passivation, further at least one layer of polyimide over said at least one layer of negative photoresist;

access to said integrated circuitry for external contact by at least one second via having a second diameter through said at least one layer of polyimide, further through said at least one layer of negative photoresist, said second diameter being smaller than said first diameter, said second via being aligned with said first via;

a layer of UBM metal over said at least one layer of polyimide, with a portion of said layer of UBM metal layer extending into said at least one second via and further extending into said at least one first via, contacting said integrated circuitry; and a layer of solder or a compound thereof over said layer of UBM metal, said layer of solder or a compound thereof being aligned with said at least one second via.

2. The conductive bump of claim 1 wherein said at least one layer of passivation comprises PE $Si_3N_4$ deposited to a thickness between about 200 and 800 Angstrom.

3. The conductive bump of claim 1 wherein said at least one of said at least one layer of passivation is selected from the group comprising the materials PE $Si_3N_4$, $SiO_2$, a photosensitive polyimide, phosphorous doped silicon dioxide and titanium nitride deposited to a thickness between about 200 and 800 Angstrom.

4. The conductive bump of claim 1 wherein said at least one layer of polyimide comprises polyimide insulator deposited to a thickness between about 300 and 800 Angstrom.

5. The conductive bump of claim 1 wherein said layer of Under Bump Metallurgy comprises a layer of chromium followed by a layer of copper followed by a layer of gold.

6. The conductive bump of claim 1 wherein said layer of Under Bump Metallurgy comprises a plurality of sub-layers of different metallic composition.

7. The conductive bump of claim 1 wherein said contact pad on said semiconductor substrate is electrically connected with a semiconductor device with a least one conductive line of interconnect or with at least one conductive contact point.

8. A conductive bump formed on a semiconductor surface, overlying a layer of Under Bump Metallization (UBM) comprising:

a semiconductor surface, said semiconductor surface having been provided with integrated circuitry, at least one layer of passivation over said semiconductor surface, said at least one layer of passivation comprising PE $Si_3N_4$ having a thickness between about 200 and 800 Angstrom, at least one contact pad in or over said substrate;

access to said integrated circuitry for external contact by at least one first via having a first diameter extending through said at least one layer of passivation, said at least one first via being aligned with said at least one contact pad;

at least one layer of negative photoresist over said at least one layer of passivation, further at least one layer of polyimide insulator over said at least one layer of negative photoresist, said layer of at least one layer of polyimide insulator having a thickness between about 300 and 800 Angstrom;

access to said integrated circuitry for external contact by at least one second via having a second diameter through said at least one layer of polyimide insulator, further through said at least one layer of negative photoresist, said second diameter being smaller than said first diameter, said second via being aligned with said first via;

a layer of UBM metal over said at least one layer of polyimide insulator, with a portion of said layer of UBM metal extending into said at least one second via and further extending into said at least one first via to make electrical contact with said integrated circuitry, said layer of UBM metal comprising one or more layers of different metallic composition; and a layer of solder or a compound thereof over said layer of UBM metal, said layer of solder or a compound thereof being aligned with said at least one second via.

9. The conductive bump of claim 8 wherein said semiconductor surface is selected from a group of surfaces comprising semiconductor substrates, printed circuit boards, flex circuits or a metallized or glass substrate or semiconductor device mounting support.

* * * * *